United States Patent [19]

Stouraitis

[11] Patent Number: 5,097,434
[45] Date of Patent: Mar. 17, 1992

[54] HYBRID SIGNED-DIGIT/LOGARITHMIC NUMBER SYSTEM PROCESSOR

[75] Inventor: Thanos Stouraitis, Columbus, Ohio

[73] Assignee: The Ohio State University Research Foundation, Columbus, Ohio

[21] Appl. No.: 653,757

[22] Filed: Feb. 11, 1991

Related U.S. Application Data

[63] Continuation of Ser. No. 592,351, Oct. 3, 1990, abandoned, which is a continuation of Ser. No. 337,896, Apr. 14, 1989, abandoned.

[51] Int. Cl.$^5$ .......................... G06F 7/00; G06F 15/00
[52] U.S. Cl. ............................. 364/746.2; 364/748.5
[58] Field of Search ............... 341/56, 57; 364/715.03, 364/746.2, 748.5, 751, 752, 761, 768

[56] References Cited

U.S. PATENT DOCUMENTS

| | | | |
|---|---|---|---|
| 3,535,498 | 10/1970 | Smith, Jr. | 364/752 |
| 3,754,237 | 8/1973 | de Laage de Meux | 341/56 |
| 4,243,976 | 1/1981 | Warner et al. | 341/57 |
| 4,531,124 | 7/1985 | Lassallette et al. | 364/748.5 |
| 4,682,302 | 7/1987 | Williams | 364/748.5 |
| 4,700,319 | 10/1987 | Steiner | 364/752 |
| 4,720,809 | 1/1988 | Taylor | 364/748.5 |
| 4,734,875 | 3/1988 | Florence et al. | 364/748.5 |
| 4,864,528 | 9/1989 | Nishiyama et al. | 364/754 |
| 4,866,655 | 9/1989 | Nishiyama et al. | 364/754 |
| 4,866,657 | 9/1989 | Nishiyama et al. | 364/768 |
| 4,868,777 | 9/1989 | Nishiyama et al. | 364/754 |
| 4,873,660 | 10/1989 | Nishiyama et al. | 364/768 |
| 4,878,190 | 10/1989 | Darley et al. | 364/752 |
| 4,878,192 | 10/1989 | Nishiyama et al. | 364/768 |

OTHER PUBLICATIONS

Avizienis, "Binary-Compatible Signed-Digit Arithmetic" Proceedings—Fall Joint Computer Conference, 1964, pp. 663-672.
Atkins, "Design of the Arithmetic Units of ILLIAC III: Use of Redundancy and Higher Radix Methods", IEEE Trans. on Computers, vol. C-22, #2, pp. 113-120, Feb. 1973.
Majerski, "Square-Rooting Algorithms for High-Speed Digital Circuits" IEEE Trans on Computers vol. C-34, #8, pp. 724-733, Aug. 1985.

Primary Examiner—Dale M. Shaw
Attorney, Agent, or Firm—Frank H. Foster; Kremblas, Foster & Millard

[57] ABSTRACT

The combination of the signed digit (SD) and the logarithmic number system (LNS) for the creation of a hybrid SD/LNS processor. An optimal radix was chosen for the SD system by taking into account both the speed of operations and the memory storage requirements. A technique for parallel converison of SD to sign-magnitude numbers is disclosed. The optimal-SD-radix hybrid LNS processor exploits the parallelism that is offered by the SD number system, and exhibits efficient overflow detection mechanism. It is at least 10 gate delays faster per each LNS addition/subtraction than state-of-the-art traditional LNS processor designs and 8 gate delays faster per each LNS multiplication/-division. The gain in speed is achieved at the expense of some small PLAs that have to be included in the design and a small degree of additional complexity of the circuitry.

1 Claim, 5 Drawing Sheets

HYBRID SIGNED-DIGIT/LOGARITHMIC NUMBER SYSTEM PROCESSOR

This is a continuation of application Ser. No. 07/592,351, filed Oct. 3, 1990, which is a continuation of Ser. No. 07/337,896, filed Apr. 14, 1989, both now abandoned.

BACKGROUND OF THE INVENTION

The high data rates and wide dynamic range required by many applications exceed the performance capabilities of current general-purpose computing equipment or dedicated application-specific processors. A speech-understanding system with a relatively large vocabulary, for example, is likely to require as much as 100 million instructions per second. To respond to the ever increasing needs for computing power-and in addition to parallel processing techniques- the logarithmic number system (LNS) has been introduced as an alternative that combines the best of two worlds; speed of fixed-point (FXP) and wide dynamic range of floating-point (FLP) number systems.

In a radix-r LNS, a real number X is represented as a signed-exponent word, x, and its value x is determined as $$x = (S_x)r^x;$$

$$X = X_s \sum_{i=0}^{m-1} X_i 2^{i-F} X_i \in \{0, 1\},$$

where in practice, the exponent x is coded as an (m+2)-bit word consisting of $S_x$ (the sign of X), $x_S$ (the sign of x), F fractional and m−F=I integer magnitude bits. For $A = S_A r^a$, $B = S_B r^b$, and $C = S_C r^c$, arithmetic in this system is performed in the following manner:

| | | |
|---|---|---|
| Multiplication | $[C = A \times B]$ | $c = a + b$ and $S_C = S_A \oplus S_B$ |
| Division | $[C = A \div B]$ | $c = a - b$ and $S_c = S_A \oplus S_B$ |
| Addition ($|A| \geq |B|$) | $[C = A + B]$ | $c = a + \Phi_r(v)$ and $S_c = S_A$ with $v = a - b$ and $\Phi_r(v) = \log_r(1 + r^{-v})$ |
| Subtraction ($|A| \geq |B|$) | $[C = A - B]$ | $c = a + \Psi_r(v)$ and $S_c = S_A$ with $v = a - b$ and $\Psi_r(v) = \log_r(1 - r^{-v})$ |
| Square root | $[C = \sqrt{A}]$ | $c = \frac{a}{2}$ and $S_c = S_A$ |
| Squaring | $[C = A^2]$ | $c = 2a$ and $S_c = S_A$ |

A basic architecture for the above LNS operations is shown in FIG. 1. It can be observed that multiplication and division in LNS need only one additive operation while two additions, one magnitude comparison, and one table-lookup operation ($\Phi_r$ or $\Psi_r$) are needed for LNS addition and subtraction. In order to reduce the size and increase the speed of the LNS processors, the size of the look-up tables and the delay of the additive operations must be reduced. Techniques to reduce the size of the look-up tables and increase the precision of the system have been reported in the literature, while the current state of the art is expressed by a recently proposed 10-bit LNS processor.

SUMMARY OF THE INVENTION

A new method for enhancing the speed of LNS processors is based on combining the signed-digit (SD) number system and LNS for the creation of a novel hybrid SD/LNS processor. The SD arithmetic offers digit-parallel addition/subtraction and regular layout for VLSI designs. Since most basic LNS operations are based on additive operations, it is reasonable to expect a significant speed up in the execution if additions are performed after prior transformation of the operands in the SD format. However, the SD number system is redundant and requires large memory space for the storage of data. The tables $\Phi_r$ and $\Psi_r$ would be huge and slow if their input addresses were in SD format. This problem is bypassed by introducing a fast and economical method to resolve the redundancies before accessing the lookup tables. It is based on converting the SD numbers into a sign-magnitude (SM) format by using several small PLAs which exhibit a time delay that is almost independent of the word length of the operands.

Instrumental in the design of the SD/LNS processor was the choice of the radix $r_{sd}$ of the SD number system (SDNS). Different SDNS radices need different numbers of bits for representation of each digit of the SD numbers. The number of bits affects the speed and complexity of the parallel adder/subtractor; most importantly, it affects most table reduction techniques that can be used and therefore affects the size of the lookup tables. it is shown that if the dominating factors in selecting the radix are the size of the lookup tables and the speed of the LNS processors, the optimal radix is equal to two.

The design of the hybrid SD/LNS processor is compared to already existing conventional binary LNS processors with regard to the speed of the processors (in terms of gate delays for a non-pipelined mode of operation) and the size of the memory lookup tables $\Phi_r$ and $\Psi_r$.

DETAILED DESCRIPTION

Signed-digit Number Representations

Figure 1:
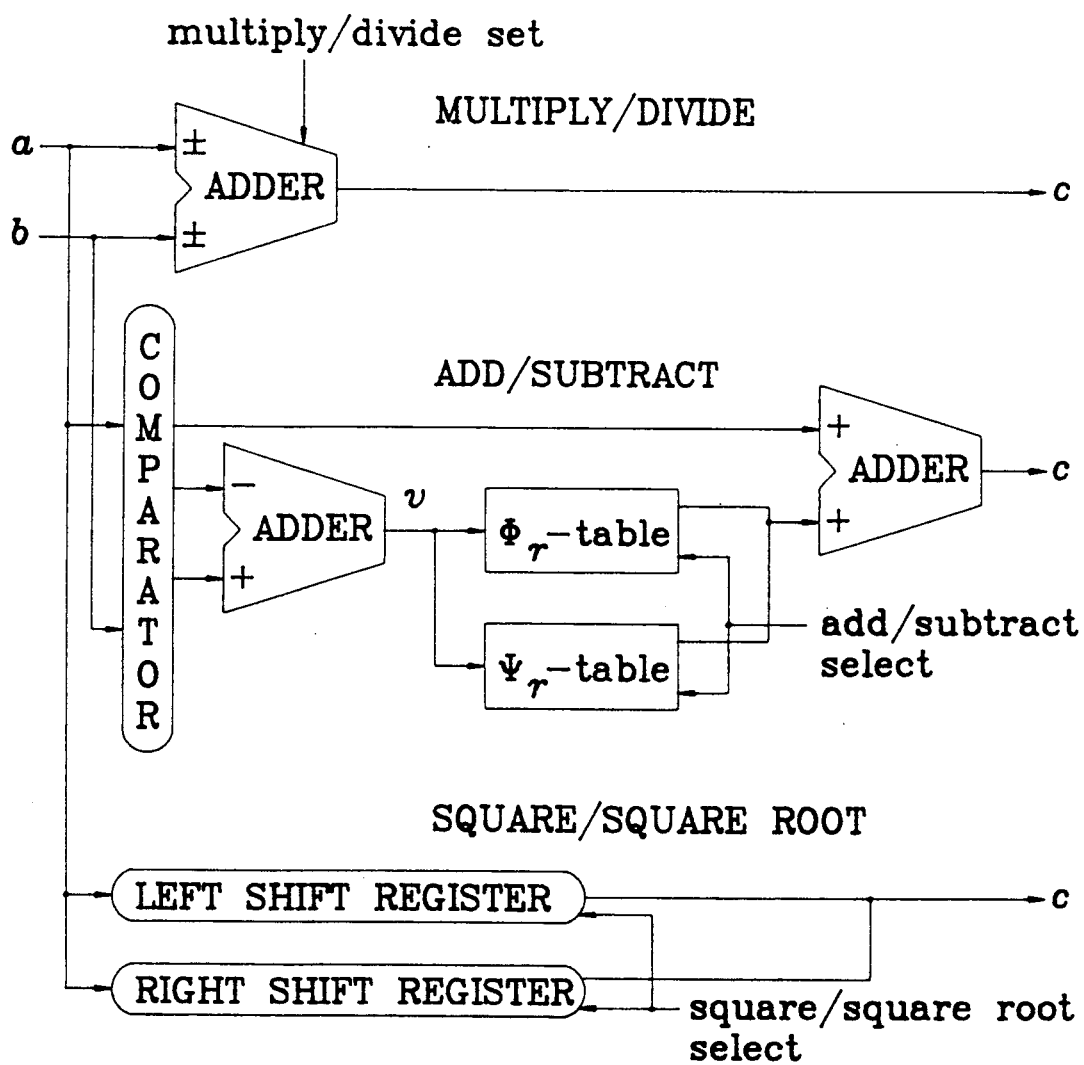
FIG. 1 is a block diagram illustrating a basic LNS arithmetic unit for six basic arithmetic operations.

The main advantage of the SD representation is that no serial carry propagation is required for addition or subtraction; that is, the time duration of the operation is independent of the length of the operands and equal to the time required for addition or subtraction of two digits. To allow for fully-parallel addition/subtraction, the range of allowed values of the radix $r_{sd}$ and the digits themselves must be appropriately restricted. These restrictions affect the access time and the size of the memory tables in the SD/LNS processors. The above issues are discussed next for various SD representations.

A. General SD Range Requirements

In a conventional SM representation, an (n+1)-digit number $x = x_S x_{n-1} x_{n-2} \ldots x_0$ has a value of $$x = x_s \times \sum_{i=0}^{n-1} x_i r^i,$$

where $x_s$ is the sign bit of x.

If the same radix, called $r_{sd}$, is used for the SD system, this number can be represented as an n-digit SD number $z = z_{n-1} z_{n-2} \ldots z_0$ with the same algebraic value $$z = x = \sum_{i=0}^{n-1} z_i r_{sd}^i.$$

The conversion from x to z is performed by using the relationships:

$$x_s x_i = r_{sd} t_{i+1} + w_i$$

$$Z_i = w_i + t_i$$

with $t_{i+1}$ given by $$t_{i-1} = \begin{cases} 1 & \text{when } x_i > w_{max} \\ 0 & \text{when } w_{min} \leq x_i \leq w_{max} \\ \overline{1} & \text{when } x_i < w_{min}. \end{cases}$$

wherein $w_i$ is the interim sum digit with predefined maximum and minimum values $w_{max}$ and $w_{min}$ respectively and $t_i$ is the transfer digit.

Totally parallel addition/subtraction of two SD numbers y and z is performed as $$z_i + y_i = r_{sd} t_{i-1} + w_i$$

$$s_i = w_i + t_i.$$

where $t_{i-1}$ is obtained from $$t_{i-1} = \begin{cases} 1 & \text{when } z_i + y_i > w_{max} \\ 0 & \text{when } z_i + y_i \leq w_{max} \\ \overline{1} & \text{when } z_i + y_i < w_{min}. \end{cases}$$

The correct implementation of the SD number system through (3-6) and the assumption for unique representation of zero in SD format require that $r_{sd} > 2$ and impose a series of requirements for the maximum and minimum values of the digits $z_i$, $t_i$ and $w_i$. Based on these requirements, it is concluded that the number of values assumed by a signed digit varies from $r_{sd}+2$ to $2r_{sd}-1$. However, a minimal-redundancy SD representation (with only $r_{sd}+2$ values) is preferred because of its minimal storage requirements and implicit minimal complexity of the adder logic. Furthermore, a symmetric representation ($z_{min} = -z_{max}$) yields the shortest possible range, a simple analysis of the overflow conditions, and simple procedures for changing of the sign of numbers (changing only the sign of individual digits). Summarizing the results given by Avizienis, the range of values of the signed digits is determined as follows:

1. For an odd radix $r_0 \geq 3$, $$z_i \in \left\{ -\frac{1}{2}(r_0+1), \ldots, -1, 0, 1, \ldots, \frac{1}{2}(r_0+1) \right\}$$

which, for $r_0 = 3$, $\rightarrow z_i \in \{-2, -1, 0, 1, 2\}$.

and the number of values for the signed digits may assume is $r_0 + 2$.

2. For an even radix $r_e \geq 4$, $$z_i \in \left\{ \left(-\frac{1}{2}r_e + 1\right), \ldots, -1, 0, 1, \ldots, \left(\frac{1}{2}r_e + 1\right) \right\}.$$

and the number of values assumed by the signed digits is $r_e + 3$.

B. A Modified Signed-Digit Representation

Trying to reduce the redundancy of the SD representation the radix can be allowed to be equal to two. This results in the so-called "modified" SD representation which will be referred to as SD-2 hereafter. The conversion from SM to SD-2 representation is performed by using the relationships:

$$x'_i = r_{sd} t'_{i+1} + w'_i$$

$$w'_i + t'_i = r_{sd} t''_{i+1} + w''_i$$

$$z'_i = w''_i + t''_i.$$

where $t'_{i+1}$ and $t''_{i+1}$ are given by $$t'_{i-1} = \begin{cases} 1 & \text{if } x'_i \geq w'_{max} \\ 0 & \text{if } w'_{min} < x'_i < w'_{max} \\ \overline{1} & \text{if } x'_i \leq w'_{min} \end{cases}$$

$$t''_{i-1} = \begin{cases} 1 & \text{if } w'_i + t'_{i-1} \geq w'_{max} + 1 \\ 0 & \text{if } w'_{min} - 1 < w'_i + t'_{i-1} < w'_{max} + 1 \\ \overline{1} & \text{if } w'_i + t'_{i-1} \leq w'_{min} - 1. \end{cases}$$

Here and $w'_{max}$ and $w'_{min}$ are the predefined maximum and minimum values of $w'_i$ respectively.

The parallel addition of two SD numbers z and y can be performed as:

$$z'_i + y'_i = r_{sd} t'_{i+1} + w'_i$$

$$w'_i + t'_i = r_{sd} t''_{i+1} + w''_i$$

$$s'_i = w''_i + t''_i$$

where $t'_{i+1}$ and $t''_{i+1}$ are obtained from $$t'_{i+1} = \begin{cases} 1 & \text{if } z'_i + y'_i \geq w'_{max} \\ 0 & \text{if } w'_{min} < z'_i + y'_i < w_{max} \\ \overline{1} & \text{if } z'_i + y'_i \leq w'_{min} \end{cases}$$

$$t''_{i+1} = \begin{cases} 1 & \text{if } w'_i + t'_{i+1} \geq w'_{max} + 1 \\ 0 & \text{if } w'_{min} - 1 < (w'_i + t'_{i+1}) < w'_{max} + 1 \\ \overline{1} & \text{if } w'_i + t'_{i+1} \leq w'_{min} - 1. \end{cases}$$

For a symmetric minimal-redundancy SD-2 representation, the range of values of the digits is determined by the $r_e + 1$ values $\{-\frac{1}{2}r_e, \ldots, -1, 0, 1, \ldots, \frac{1}{2}r_e\}$ for an even radix $r_3 \geq 2$, and the $r_0+2$ values $\{-\frac{1}{2}(r_0+1), \ldots, -1, 0, 1, \ldots, \frac{1}{2}(r_0+1)\}$ for an odd radix $r_0 \geq 3$.

For odd radices, the number of digit values is the same for regular and SD-2 representations. However, this number is reduced by two for the SD-2 representation when compared to other SD formats when it comes to even radices A reduced number of values results in less storage requirements. The penalty paid is the delay required for the propagation of the additional transfer digit and the added complexity of the circuits that perform conversion and addition/subtraction.

Detection Of Overflow Of Signed-Digit Numbers

An issue that is of importance for the proper design of computer systems is the simplicity of the overflow detection mechanism. For an n-digit SD number $z = z_{n-1} z_{n-2} \ldots z_0$, the maximum possible range of its algebraic value z is $$-\sum_{i=0}^{n-1} z_{max} r_{sd}^j \leq z \leq \sum_{i=0}^{n-1} z_{max} r_{sd}^j.$$

The above definition of dynamic range does not allow for easy detection of the overflow/underflow conditions.

However, if z is assumed to have an extra digit $z_n$ as the first one for a final format $z = z_n z_{n-1} z_{n-2} \ldots z_0$, then its algebraic value becomes $$z = z_n r_{sd}^n + \sum_{i=0}^{n-1} z_i r_{sd}^j.$$

Also assume that the range is defined as $$-\left( r_{sd}^n + z_{max} \sum_{i=0}^{n-2} \right) r_{sd}^j \leq z \leq r_{sd}^n + z_{max} \sum_{i=0}^{n-2} r_{sd}^j.$$

Now the overflow can be detected by simple $z_{n-1}$.
Positive overflow occurs if $z_n = 1$ while $z_{n-1} \geq 1$, or if $z_n > 1$.
Negative overflow occurs if $z_n = \bar{1}$ while $z_{n-1} \leq -1$, or if $z_n < \bar{1}$.

Of course, if z is the result of arithmetic operations like addition/subtraction, multiplication/division, the transfer digit $z_{tn}$ from the nth-digit position will have to be checked before the above check. Overflow-underflow will occur whenever $z_{tn} = 1/\bar{1}$.

Conversion of LNS Exponents Between SD And SM Formats

As mentioned earlier, a fast and economical method for reducing the redundancies of the SD numbers used as inputs of the lookup tables for the LNS addition/subtraction operations is needed. Already existing conversion algorithms are of sequential nature and therefore slow. In this section, a method for parallel conversion of SD numbers to an SM format is proposed. In addition, a procedure for SM-to-SD conversion is also discussed since the output of the PLAs is in SD format. It is found that the conversion from SM to SD-2 format needs no computation and thus it is easy to program the lookup table memory.

A. SD to SM conversion

Traditionally, SD-to-SM conversion is done by using the original SD number to form one positive and one negative SM numbers and adding them together by using a carry look ahead adder (CLA). The delay of this conversion procedure is equal to one CLA delay plus the delay required for the formation of the two opposite-sign numbers and depends on the word length of the SD numbers. A conversion technique with time delay almost independent of the word length is developed now.

Suppose that an SD number $z = z_n z_{n-1} z_{n-2} \ldots z_0$ is to be converted to an SM number $y = y_s y_{n-1} y_{n-2} \ldots y_0$ and that both systems use the same radix $r_{sd}$. Define the SD numbers $I_i, i=0, \ldots, n-1, n$ as $$I_n = z_n z_{n-1} \ldots z_0$$

$$I_{n-1} = z_{n-2} \ldots z_0$$

$$I_{n-2} = z_{n-2} \ldots z_0$$

$$I_{n-3} = z_{n-3} \ldots z_0$$

$$\ldots$$

$$I_0 z_0$$

and $P_i, i=0,1,\ldots,n-1, n$ as $$P_i = \begin{cases} 0 & \text{if } I_i = 0 \\ 1 & \text{if } I_i > 0 \\ \bar{1} & \text{if } I_i < 0. \end{cases}$$

Then, the procedure to convert each signed digit $z_i$ to an SM digit $y_i$ is given as a series of the following steps:

Generate $P_i$ for each $I_i, i=0,1,\ldots,n-1, n$. $I_i$ doesn't need to be generated. This can be implemented by using a small Programmable Logic Array (PLA) (called "sign detector" in the following sections) for each $P_i$. The size of each of these PLAs depends on the length of the corresponding $I_i$. The biggest PLA is the one used for generating $P_{n-1}$ and accepts as inputs all n digits of z.

2. Complement $z_i$ and $P_i$ if $P_n = \bar{1}$. Assume that $z'_i$ and $P'_i$ are the outputs of the circuits performing this complementation, called digit complementor and p complementor respectively. Then $$z'_i = \begin{cases} z_i, & \text{if } P_n = 0 \text{ or } 1 \\ -z'_i, & \text{if } P_n = \bar{1} \end{cases}$$

$$P'_i = \begin{cases} P_i, & \text{if } P_n = 0 \text{ or } 1 \\ -P_i, & \text{if } P_n = \bar{1}. \end{cases}$$

3. Generate $y_i$ according to the following cases:

$$y_i = \begin{cases} 0 & \text{if } P'_i = 0 \\ z'_i & \text{if } P'_i = 1 \text{ and } P'_{i-1} = 0 \text{ or } 1 \\ z'_i - 1 & \text{if } P'_i = 1 \text{ and } P'_{i-1} = \bar{1} \\ z'_i + r_{sd} & \text{if } P'_i = \bar{1} \text{ and } P'_{i-1} = 0 \text{ or } \bar{1} \\ z'_i + r_{sd} - 1 & \text{if } P'_i = \bar{1} \text{ and } P'_{i-1} = 1 \end{cases}$$

4. The sign bit of the SM number is determined as $$y_n = \begin{cases} 1 & \text{if } P_n = 1. \\ 0 & \text{if } P_n = 0 \text{ or } 1. \end{cases}$$

The above steps can be performed for each digit in parallel. The conversion time depends on the delays of the three stages of operation that generate the $P_i$s (through small PLAs), complement the $z_i$s and $P_i$s, and finally generate the $y_i$s. The last two stages can be implemented using combinational logic and their delay is independent of the word length. The first stage requires PLAs with a varying number of inputs and with the maximum number of these inputs depending on the word length. Since the actual size of the PLAs is small, an increase of the word length would add a latency that can be considered negligible. Therefore, the conversion time can be considered to be almost independent of the word length. The architecture of such a converter is given in FIG. 2.

The actual implementation of each of the building blocks (sign detectors, digit complementors and p complementors) depends on the radices of the two systems, with their complexity increasing as the radices increase.

B. SM to SD conversion

The general conversion procedure from SM to SD representation has been described by Eqs. (3, 4, 7, 8, 9). A special case is the radix-2 SD-2. In this case, no computation is required for conversion of an n-bit SM binary integer $x_s x_{n-1} x_{n-2} \ldots x_0$ ($x_i \in \{0,1\}$) to an (n+1)-digit SD-2 integer $z_n z_{n-1} z_{n-2} \ldots z_0$ with the same algebraic value $$\sum_{i=0}^{n-1} x_i 2^i, \text{ where } z_i = x_s x_i, i = 0, 1, \ldots, n-1 \text{ and } z_n = 0.$$

Optimal SD Radix For The Hybrid SD/LNS Processor

The radix of a SD number system defines to a large degree the range of values of the digits and the way that operations are performed. The employment of an appropriate SDNS for representing LNS operands is influenced mainly by three factors:

(a) The latency of the various operations performed in a hybrid SD/LNS processor. These operations includes parallel addition/subtraction, conversion from SD to SM format, and complementing SD numbers.
(b) The size of the lookup tables used in LNS addition/subtraction.
(c) The size of the memory which contains the operands-called hereafter as operand memory (OM).

Generally speaking, the larger the radix, the more complex and slow will be the circuitry of the SD/LNS processor. However, the actual gate delays can only be calculated after the circuit is designed.

The access time of the memory lookup tables increases with their size. Therefore, the latter is the most critical factor that influences the choice of the radix for fast SD/LNS designs. Since the table input can be quickly converted to an SM format, table-reduction techniques that have been used by traditional LNS processors can be employed by the hybrid processors as well. Full utilization of the memory space can be achieved for a radix-2 design. The fact that the output of $\Phi_r$ is always positive and the output of $\Psi_r$ is always negative can result in significant savings for a SD/LNS design since the sign bit of each digit of the outputs need not be stored in the tables. This means that the size and therefore the latency of the lookup tables of the hybrid SD/LNS processor will be no bigger than the one required by conventional LNS design.

The size of the OM is proportional to the number of bits in the SD number. To determine the effect of the radix on the size of the OM, it is necessary to first determine its effect on the number of bits of the SD numbers. The number of bits needed to represent an SD number that has the same precision and dynamic range as in conventional binary LNS processors will be determined next.

Assume a conventional SM/LNS (m+2)-bit representation of a real number $X = S_x x_s x_{m-1} x_{m-2} \ldots x_0$ where $S_x$ is the sign bit of the LNS number and $x_s$ is the sign bit of the exponent. Furthermore, assume that there are F bits for the fractional part and I bits for the integer part, with I+F=m. For an (n+2)-digit SD/LNS representation of the same number $z_s z_{tn} z_{n-1} \ldots z_0$, shown in the diagram below, it is assumed that the fractional part of F' digits and the integer part has

| bits per digit: | 1 | 2 | b | ... | b |
|---|---|---|---|---|---|
| | $z_n$ | $z_{n-1}$ | $z_{n-2}$ | ... | $z_0$ |

I' digit, while $z_{tn}$ has always a two-bit representation. In order for a radix-$r_{sd}$ SD/LNS representation to offer the same precision as the SM/LNS one, F' must satisfy $$r_{sd}^{-F'} \leq 2^{-F}.$$

For the two systems to cover the same dynamic range, n must satisfy $$r_{sd}^n + \sum_{i=0}^{n-2} z_{max} r_{sd}^j \geq \sum_{i=0}^{m-1} 2^i.$$

Assume that b bits are needed to represent each signed digit (except for the one-bit $z_s$ and the two-bit $z_n$. Then for a regular SD number representation $$b = \begin{cases} \lceil \log_2(r_0 + 2) \rceil & \text{for odd radices} \\ \lceil \log_2(r_e + 3) \rceil & \text{for even radices} \end{cases}$$

and for an SD-2 number representation.

TABLE 1

Ratio of the Sizes of the Operand Memory of a SD/LNS and a Conventional LNS Processor for Various SD Number System Radices.

| Radix $r_{sd}$ | n | F' | b | T | m + 2 | MR = T/(m + 2) |
|---|---|---|---|---|---|---|
| 2 | 18 | 12 | 2 | 39 | 20 | 1.95 |
| 4 | 9 | 6 | 3 | 30 | 20 | 1.50 |
| 8 | 6 | 4 | 4 | 27 | 20 | 1.35 |

$$b = \begin{cases} \lceil \log_2(r_0 + 2) \rceil & \text{for odd radices} \\ \lceil \log_2(r_e + 1) \rceil & \text{for even radices} \end{cases}$$

where, [x] means the smallest integer that is larger than or equal to x. The total number of bits T needed to represent each SD/LNS number is found to be $$T = bxn + 3$$

Assuming that F=12 (technology limit for fast tables) for a conventional LNS processor and using (22-26), the size of the OM for an SD/LNS processor of the same dynamic range and precision can be compared to the one needed by conventional radix-2 LNS designs. The results are tabulated in Table 1. The ratio of the numbers of bits per stored number (T and m+2 for the two designs respectively) is given as MR and it can be seen to decrease as $r_{sd}$ increases.

Although the memory ratio for $r_{sd}=2$ is the largest, the circuits for the parallel adder/subtractor, the SD-to-SM converter, and the complementor of SD numbers are faster. If the operand memory for the specific application is not large, then the increased latency caused by the increase of the memory ratio will have a minimal effect. Under this assumption, the optimal choice of the radix for the hybrid SD/LNS processor is $r_{sd}=2$ and this leads to the design presented in the next section.

A radix-2 Hybrid SD/LNS Processor Design

Figure 3:
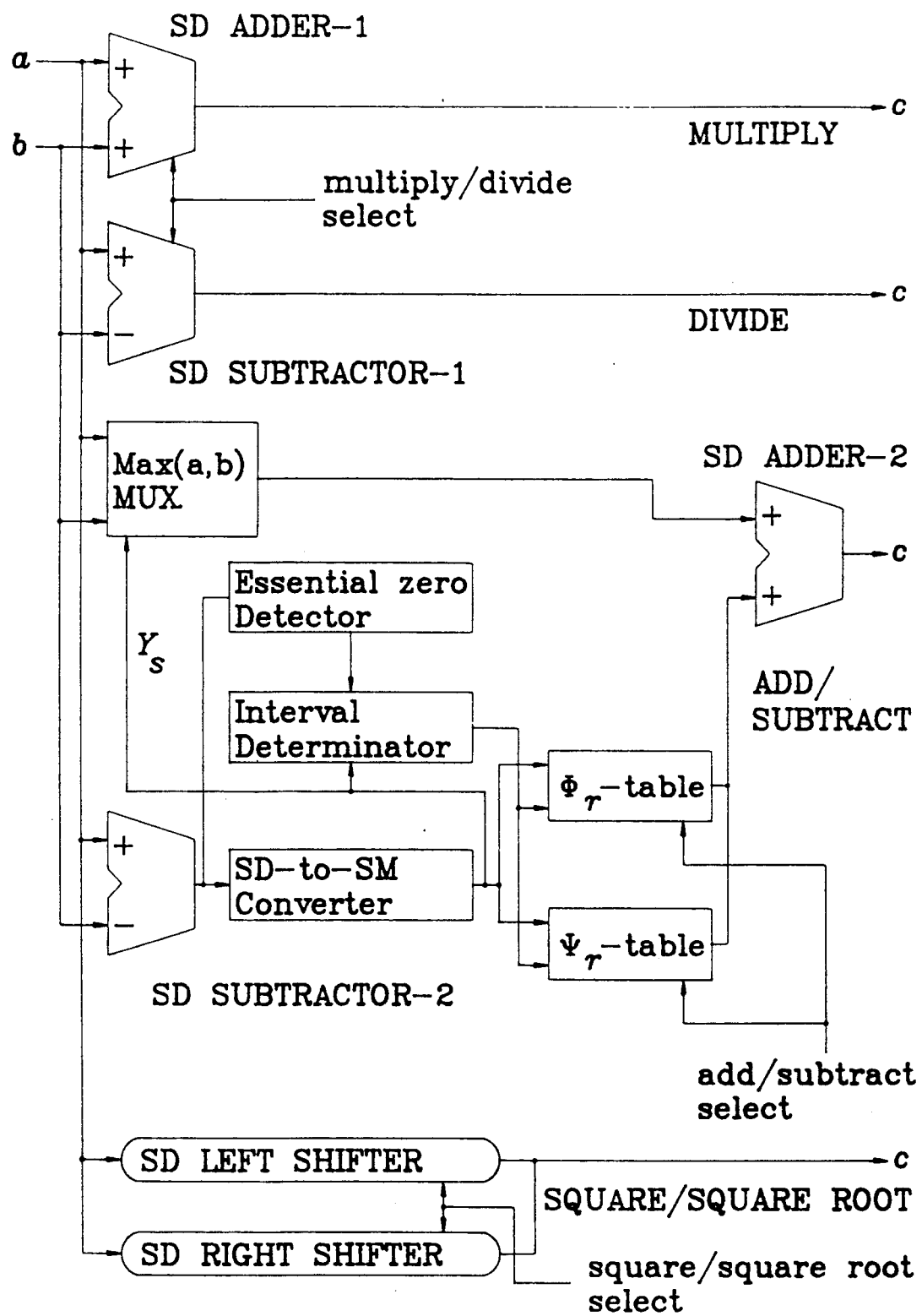
FIG. 3 is a diagram of the architecture for a hybrid SD/LNS processor.

The architecture of a radix-2 hybrid SD/LNS processor is shown in FIG. 3. The operands a and b as well as the result c are SD-2 numbers. The following functional units can be found in FIG. 3:

1. The SD Adder/Subtractor. There are two SD-2 adders and two SD-2 subtractors; adder-1 is used for multiplication and subtractor-1 for division. The subtraction of the two exponents that is required in LNS add/subtract operations is performed in subtractor-2. The addition of the output of the lookup tables to the exponent with the maximum absolute value is performed in adder-2.

2. The SD-to-SM Converter converts the SD-2 output of subtractor-2 in SM format before addressing the lookup tables. The sign bit $y_s$ of the output of the converter is used to select the maximum value of the two operands a and b.

3. The Essential Zero Detector implements a table reduction technique [9] by detecting those actual $\Phi_r$ or $\Psi_r$ functions that are smaller than the absolutely smallest nonzero SD-2 number defined by the processor word length. These addresses are called 'essential zeroes' and are all mapped to this smallest number.

4. The Interval Determinator generates the signals required for the selection of the lookup tables that correspond to intervals determined by the employed table-reduction techniques [10].

5. The Right/left shifter performs the square/square root operations.

The various functional units of the radix-2 SD/LNS processor are developed below. In the following, it is assumed that each digit $z_i$ of a SD number is given as $z_i^1 z_i^0$ and more specifically as 00,01,10 for $z_i = 0, 1, \bar{1}$ respectively.

A. Signed-Digit Adder/Subtractors

Efficient SD-2 adder/subtractors have been investigated and designed by Takagi et al. [14]. In their work, only four gate delays are needed to perform the parallel addition/subtraction by using dual-pole four-input logic gates. Their design is adopted in our processor.

B. SD-to-SM Converters

Figure 2A:
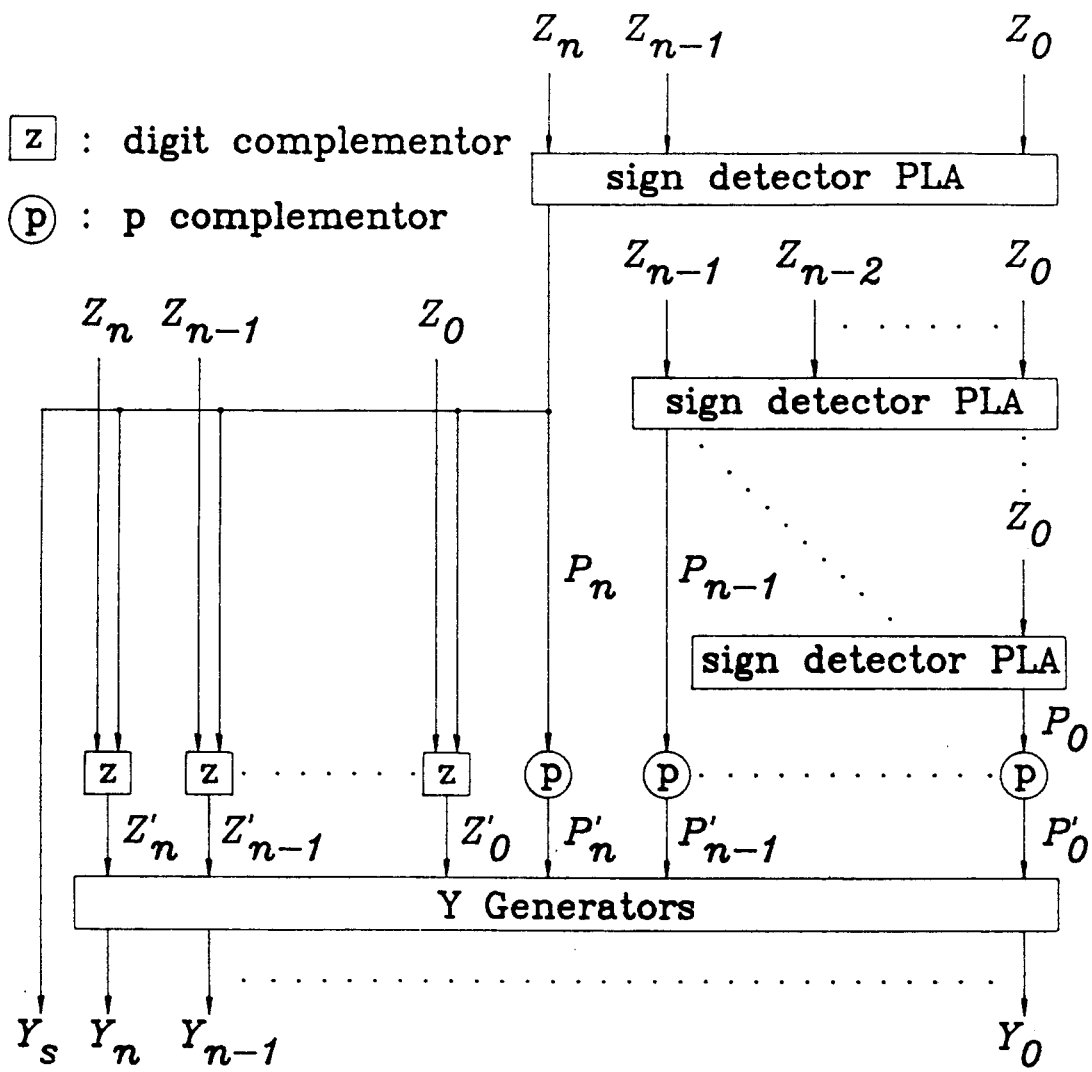
FIG. 2 comprising of FIGS. 2a and 2b are a diagram of the architecture for a signed digit to sign magnitude converter.
Figure 2B:
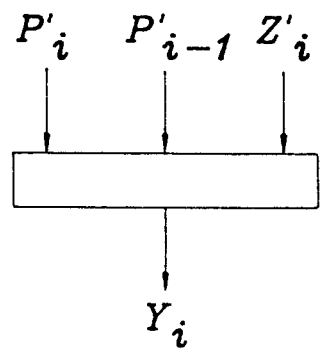

As it can be seen in FIG. 2, the first stage of the converter comprises the sign detectors which generate the $P_i$s. The second stage comprises the digit and p complementors operating in parallel and the third stage consists of the Y generator. Assume that an SD-2 number $z = z_n z_{n-1} z_{n-2} \ldots z_0$ is to be converted to an SM binary number $y = Y_s Y_n Y_{n-1} \ldots Y_0$ ($Y_s$ is the sign bit). In the following, the notation adopted in Section IV will be used with the observation that, for a radix-2 design, $P'_i$ assumes only two values:

$$P'_i = \begin{cases} 1 & \text{when } z'_i z'_{i-1} \ldots z'_0 < 0 \\ 0 & \text{when } z'_i z'_{i-1} \ldots z'_0 \geq 0. \end{cases}$$

The sign detector implements the $P_i$s. Two properties of the SD number system make feasible a simple and regular circuit design of the sign detectors. One is the uniqueness of the representation of zero in SD format. The other is that the sign of a SD number is determined solely by the sign of the most significant non-zero digit of the number. A small PLA is suitable for such a To illustrate the design, an example sign detector with only a four-digit input is given next. Assume that the input of the four-digit sign detector is $z = z_4 z_3 z_2 z_1$. Let the output be $P^1 P^0$ with $$P^1 P^0 = \begin{cases} 00 & \text{when } z = 0 \\ 01 & \text{when } z > 0 \\ 10 & \text{when } z < 0. \end{cases}$$

The truth table for this PLA is

| $z_4^1$ | $z_4^0$ | $z_3^1$ | $z_3^0$ | $z_2^1$ | $z_2^0$ | $z_1^1$ | $z_1^0$ | $P^1$ | $P^0$ |
|---|---|---|---|---|---|---|---|---|---|
| 1 | x | x | x | x | x | x | x | 1 | 0 |
| 0 | 1 | x | x | x | x | x | x | 0 | 1 |
| 0 | 0 | 1 | x | x | x | x | x | 1 | 0 |
| 0 | 0 | 0 | 1 | x | x | x | x | 0 | 1 |
| 0 | 0 | 0 | 0 | 1 | x | x | x | 1 | 0 |
| 0 | 0 | 0 | 0 | 0 | 1 | x | x | 0 | 1 |
| 0 | 0 | 0 | 0 | 0 | 0 | 1 | x | 1 | 0 |
| 0 | 0 | 0 | 0 | 0 | 0 | 0 | 1 | 0 | 1 |
| 0 | 0 | 0 | 0 | 0 | 0 | 0 | 0 | 0 | 0 |

"x" stands for "don't care".

For an $\alpha$-bit input, $\beta$-bit output and W-product term PLA, its size is defined to be a $2\alpha W + W\beta$ [15]. For an n-digit sign detector, $\alpha = 2n$, $W = 2n+1$ and $\beta = 2$. Thus, the size of the n-digit sign-detector PLA is $(4n+2)(2n+1)$ bits. If the output is dual-pole, then $\beta = 4$ and the size of the PLA will be $(4n+4)(2n+1)$ bits.

The digit complementor implements the $z_i$'s of (18). Its truth table is

| $z_i$ | $P_n$ | $z'_i$ | | $z_i^1$ | $z_i^0$ | $P_n^1$ | | $z'^1_i$ | $z'^0_i$ |
|---|---|---|---|---|---|---|---|---|---|
| 0 | x | 0 | | 0 | 0 | x | | 0 | 0 |
| 1 | 1 | $\bar{1}$ | | 0 | 1 | 0 | | 0 | 1 |
| $\bar{1}$ | 1 | 1 | or | 0 | 1 | 1 | | 1 | 0 |
| 1 | $\bar{1}$ | 1 | | 1 | 0 | 0 | | 1 | 0 |
| $\bar{1}$ | $\bar{1}$ | $\bar{1}$ | | 1 | 0 | 1 | | 0 | 1 | which results in $$z'^1_i = \overline{z_i^1 z_i^0 P_n^1} + z_i^1 \overline{z_i^0 P_n^1}$$

-continued $$z'^p = \overline{z_i^1 z_i^0 P_n^1} - z_1^1 \overline{z_i^0 P_n^1}.$$

The p complementor implements the $P_i'$ of (19).

| $P_i$ | $P_n$ | $P_i'$ | | $P_i^1$ | $P_i^0$ | $P_n^1$ | $P_i'$ |
|---|---|---|---|---|---|---|---|
| 0 | x | 0 | | 0 | 0 | x | 0 |
| 1 | 1 | 0 | | 0 | 1 | 0 | 0 |
| $\bar{1}$ | 1 | 1 | or | 1 | 0 | 0 | 1 |
| 1 | $\bar{1}$ | 1 | | 0 | 1 | 1 | 1 |
| $\bar{1}$ | $\bar{1}$ | 0 | | 1 | 0 | 1 | 0 | which results in $$P_i' = P_i^1 \overline{P_i^0 P_n^1} + \overline{P_i^1} P_i^0 P_n^1.$$

The Y generator implements the $y_i$'s of (20). Its truth table is given below

| $P_f$ | $P'_{f-1}$ | $z_f$ | $y_i$ | | $P_f^1$ | $P'_{f-1}$ | $z'_f$ | $z'^p_f$ | $y_i$ |
|---|---|---|---|---|---|---|---|---|---|
| 1 | 0 | x | 1 | | 1 | 0 | x | x | 1 |
| 1 | 1 | 0 | 1 | | 1 | 1 | 0 | 0 | 1 |
| 1 | 1 | 1 | 0 | or | 1 | 1 | 1 | 0 | 0 |
| 0 | 0 | 0 | 0 | | 0 | 0 | 0 | 0 | 0 |
| 0 | 0 | 1 | 1 | | 0 | 0 | 0 | 1 | 1 |
| 0 | 1 | x | 0 | | 0 | 1 | x | x | 0 |

Based on the above truth table the operation of the Y generator can be described by $$y_i = P_i \overline{P_{i-1}} + P_i P_{i-1} \overline{z_i^1 z_i^p} + \overline{P_i} P_{i-1} \overline{z_i^1} z_i^p.$$

Figure 4:
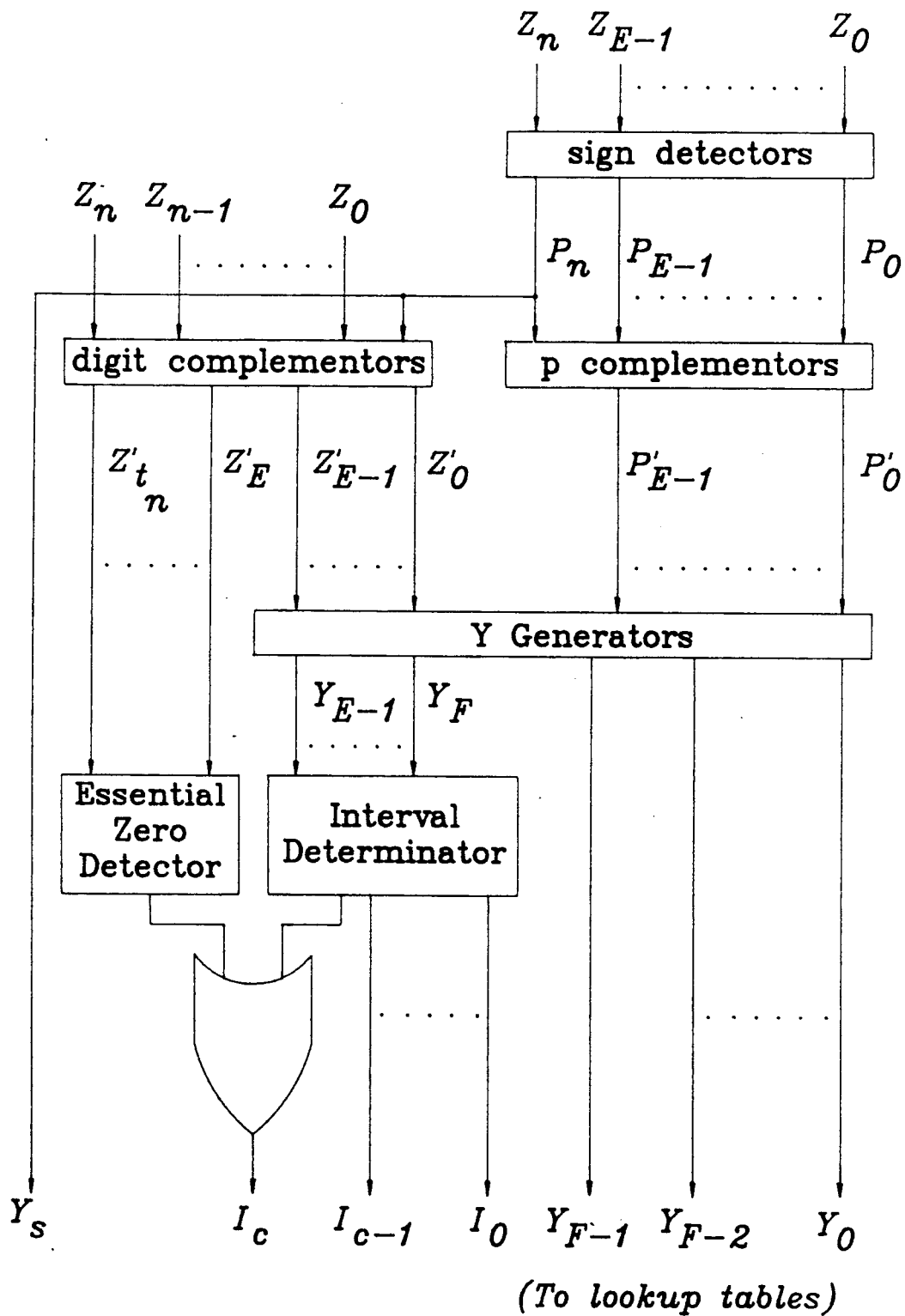
FIG. 4 is a block diagram of the SD to SM converter unit used by the SD/LNS processor.

Utilizing the earlier described SD-to-SM converter in the SD/LNS processor, the architecture for the conversion circuit is shown in FIG. 4. There, it is assumed that, following the SD-to-SM conversion, only E bits are needed to generate the interval selection signal and the address of the lookup tables. Numbers with width larger than E bits correspond to essential zeros. The lookup table is assumed to be divided into c intervals.

C. Other Units

Detailed circuit designs for the essential zero detector and interval determinator are not offered since they are very simple. Right/left shift operations on the LNS exponents for a radix-2 design can be used to perform operations like square rooting and squaring of real numbers. In an SD-2 format, these shifts can be performed by simply shifting the contents of the shift register by two bit positions at a time. The detailed circuit design of such a shifter is omitted as trivial.

Conversion Between FLP and SD/LNS Format

Floating-point number representation is the dominating choice of systems designers when a large dynamic range and high precision are simultaneously required. LNS units can assist an FLP system for such complex operations like division. In a hybrid FLP/LNS environment, FLP inputs will have to be converted to LNS exponents and LNS outputs will have to be converted to FLP format. The fastest way to perform the conversion between FLP and conventional LNS format is by using table-lookups. The FLP-to-LNS conversion requires one table lookup and one addition, whereas the LNS-to-FLP conversion requires only one table lookup. By using the same method, the conversion from FLP to SD/LNS format can be even faster because of the faster SD additions. However, the SD/LNS-to-FLP conversion will need one additional SD-to-SM conversion. In this section, the conversion of real numbers between an SD-2/LNS and a radix-2 FLP format is discussed.

A FLP to SD/LNS Conversion

Figure 5:
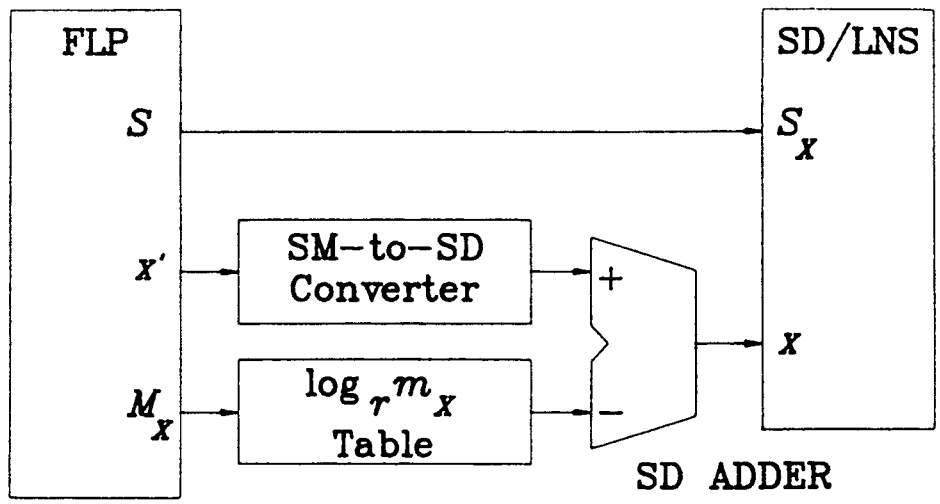
FIG. 5 is a block diagram of an FLP to SD/LNS converter.

Assume a real number X in a (I+F+2)-bit FLP representation $S_x m_x r^{s'}$, where $S_x$ is the sign bit of X, $m_x$ is the unsigned F-bit normalized mantissa of X, and $x' = x'_s x'_{I-1} \ldots x'_0$ is the signed (I+1)-bit FLP exponent It is to be converted to a LNS representation $S_x r^x$, where $S_x$ is the sign bit of the number, and x is the signed exponent of X in a (I+F+1)-bit SM format. The conversion is done by preserving the sign $S_x$ and computing $x = x' + \log_r m_x$, where the value of $\log_r m_x$ is obtained from a logarithmic lookup table. If the output of this table is in SD-2 format and the FLP exponent $x'$ is converted to SD-2 representation before the addition, then x can be obtained directly in SD-2 format by using SD-2 adder. Furthermore, since $-1 \leq \log_r m_x < 0$, the output of the lookup table is always negative. Therefore, conversion to SD/LNS format can be achieved by using the same tables employed in a FLP-to-conventional-LNS conversion scheme. The architecture for this conversion operation is shown in FIG. 5.

B. Conversion From SD/LNS to FLP Format

Assume that an SD/LNS number $X = S_x x_n x_{n-1} \ldots x_F . x_{F-1} \ldots x_0$ is to be converted to a normalized FLP format $S_x m_x r^{s'}$. Since LNS-to-FLP conversion needs one table-lookup operation to generate the FLP mantissa, the SD number $x_n x_{n-1} \ldots x_F . x_{F-1} \ldots x_0$ must first be transformed into a SM representation $y = y_s I_y . F_y$, wherein $I_y = Y_n Y_{n-1} \ldots Y_F$ is the integer part of y, $F_y = Y_{F-1} \ldots Y_0$ is the fractional part of y, and $y_s$ is the sign bit of y. Since normalized FLP representation is assumed, $m_x$ must be within the range $r^{-1} \leq m_x 1$. The conversion is thus performed by preserving the sign $S_x$ of the number and according to two cases:

1. $y \geq 0$. Since $r^{-1} \geq r^{0 \cdot F_y - 1} < 1$ and $r^y = r^{I_y + 1} \cdot r^{0 \cdot F_y - 1} = r^s \cdot m_x$, the conversion is performed by computing the FLP exponent $x' = I_y + 1$ and the FLP mantissa $m_x = r^{0-F_y-1}$.

2. $y < 0$. Since $r^- < r^{0 \cdot F_y} \leq 1$ and $r^{-|y|} = r^{-I_y} \cdot r^{0 \cdot F_y} = r^{x'} \cdot m_x$, the conversion is performed as follows:
   (a) If $F_y \approx 0$, then $x' = -I_y$ and $m_x = r^{-F_y}$.
   (b) If $F_y = 0$, then $x' = -I_y + 1$ and $m_x = r^{-1}$.

Figure 6:
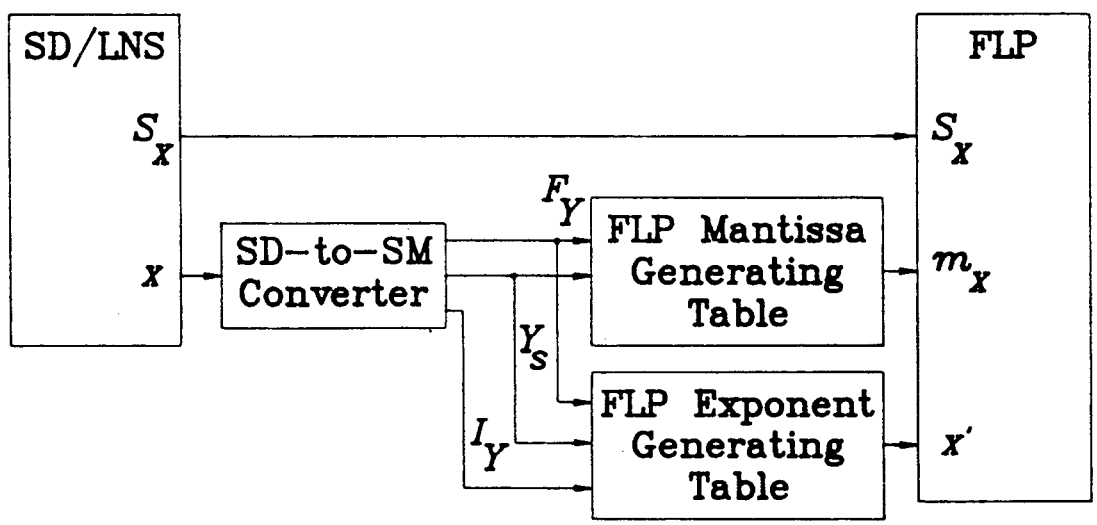
FIG. 6 is a block diagram of an SD/LNS to FLP converter.

The architecture for the conversion process is shown in FIG. 6.

Note that since the maximum absolute algebraic value of $x = x_n x_{n-1} \ldots x_F . x_{F-1} \ldots x_0$ is $(2^n + 2^{n-2} - 1) \times 2^{-F}$, going from FLP to SD/LNS and then back to FLP results in FLP numbers with an additional integer digit in their mantissa. This extra bit can be used either as a check bit for overflow over $(2^n - 1) \times 2^{-F}$ or as an extension bit of the integer part.

A hybrid signed-digit/logarithmic number system arithmetic process has been described. An optimal SD radix equal to two has been chosen as the basis for the design after considering the effects of the radix value on the circuit complexity and the size of the operand memory used by the processor. The design is enhanced by novel techniques for parallel SD-to-SM conversion. At the expense of some small PLAs, the hybrid SD/LNS processor has the following advantages:

addition/subtraction is faster by ten gate delays,
multiplication/division is faster by eight gate delays, and
more regular layout for VLSI design.

Finally, if the SD/LNS processor needs to communicate with an FLP environment, the FLP-to-SD/LNS conversion is faster than the FLP-to-LNS one. The SD/LNS-to-FLP conversion takes one more SD-to-SM conversion time. However, even when the converted input operands are manipulated only once for addition/subtraction or multiplication/division, the hybrid SD/LNS processor is still faster.

I claim:

1. An arithmetic processor circuit for performing multiplication, division, addition, and subtraction upon two operands stored in registers and representing two numbers in a signed digit logarithmic number system format, the processor circuit comprising:

(a) a first signed digit adder circuit having a pair of inputs connected to said registers for input of said operands, said first adder circuit having a multiply/divide select input for alternatively enabling or disabling the first adder circuit and having an output port for outputting the sum of the two operands when the first adder is enabled, said sum representing the product of said two numbers;

(b) a first signed digit subtracter circuit having a pair of inputs connected to said registers for input of said operands, said first subtracter circuit having a multiply/divide select input for alternatively enabling or disabling the first subtracter circuit and having an output port for output of the difference of the two operands when the first subtracter is enabled, said difference representing the quotient of said two numbers;

(c) a second signed digit subtracter circuit having a pair of inputs connected to said registers for input of said operands and having an output port for outputting the difference of said operands;

(d) a signed-digit to sign magnitude converter circuit having its input connected to the output of the second signed digit subtracter circuit and having an output for outputting a sign magnitude form of its input;

(e) a pair of storage arrays each formed as a look-up table memory and each having an input connected to the output of the signed digit to sign magnitude converter circuit, each storage array having an add/subtract select input for alternatively enabling a selected one of the storage arrays and disabling the other;

(f) a second signed digit adder circuit having a pair of inputs, one of which is connected to the outputs of said storage arrays;

(g) an essential zero detector having its input connected to the output of the second subtracter circuit and having an output;

(h) an interval determinator circuit having inputs connected to the output of the signed digit to sign magnitude converter and the output of the essential zero detector and having an output connected to inputs of the storage arrays; and (i) a multiplexer having a control input connected to the output of the signed digit to sign magnitude converter circuit, data inputs connected to said registers and an output connected to a second input of said second signed digit adder for applying the maximum absolute value of the operands to said second signed digit adder.

* * * * *